(12) United States Patent
Srirattana et al.

(10) Patent No.: US 10,084,224 B2
(45) Date of Patent: Sep. 25, 2018

(54) COMPENSATED ELECTROMAGNETIC COUPLER

(71) Applicant: SKYWORKS SOLUTIONS, INC., Woburn, MA (US)

(72) Inventors: Nuttapong Srirattana, Billerica, MA (US); Sriram Srinivasan, Bedford, MA (US); Zhiyang Liu, Dunstable, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/498,717

(22) Filed: Apr. 27, 2017

(65) Prior Publication Data

US 2017/0317395 A1 Nov. 2, 2017

Related U.S. Application Data

(60) Provisional application No. 62/463,010, filed on Feb. 24, 2017, provisional application No. 62/329,385, filed on Apr. 29, 2016.

(51) Int. Cl.
| | |
|---|---|
| *H04B 1/40* | (2015.01) |
| *H01P 5/04* | (2006.01) |
| *H03H 7/40* | (2006.01) |
| *H01Q 1/50* | (2006.01) |

(52) U.S. Cl.
CPC .................. *H01P 5/04* (2013.01); *H01Q 1/50* (2013.01); *H03H 7/40* (2013.01); *H04B 1/40* (2013.01)

(58) Field of Classification Search
CPC ....................................................... H04B 1/40

USPC .......................................................... 455/77
See application file for complete search history.

(56) References Cited

U.S. PATENT DOCUMENTS

| | | |
|---|---|---|
| 3,611,199 A | 10/1971 | Safran |
| 3,868,594 A | 2/1975 | Cornwell et al. |
| 4,460,875 A | 7/1984 | Harman |
| 4,677,399 A | 6/1987 | Le Dain et al. |
| 4,764,740 A | 8/1988 | Meyer |
| 5,038,112 A | 8/1991 | O'Neill |

(Continued)

FOREIGN PATENT DOCUMENTS

| | | |
|---|---|---|
| EP | 2503701 A2 | 9/2012 |
| JP | S62-159502 A | 7/1987 |

(Continued)

OTHER PUBLICATIONS

International Search Report and Written Opinion from corresponding International Application No. PCT/US2017/029799 dated Jul. 18, 2017.

*Primary Examiner* — April G. Gonzales
(74) *Attorney, Agent, or Firm* — Lando & Anastasi, LLP

(57) ABSTRACT

An electromagnetic coupler includes a dielectric layer with a first transmission line connecting an input port to an output port. A second transmission line on another surface of the dielectric layer forms a coupled port and an isolation port. The electromagnetic coupler provides a coupled signal at the coupled port, which is representative of an input signal at the input port. The amplitude of the coupled signal is related to the amplitude of the input signal by a coupling factor. A tuning element on the dielectric layer is configured to stabilize the coupling factor over a range of variations in thickness of the dielectric layer.

20 Claims, 10 Drawing Sheets

(56) References Cited

U.S. PATENT DOCUMENTS

| | | | |
|---|---|---|---|
| 5,222,246 A | 6/1993 | Wolkstein | |
| 5,276,411 A | 1/1994 | Woodin, Jr. et al. | |
| 5,363,071 A | 11/1994 | Schwent et al. | |
| 5,487,184 A | 1/1996 | Nagode | |
| 5,625,328 A | 4/1997 | Coleman, Jr. | |
| 5,745,016 A | 4/1998 | Salminen | |
| 5,767,753 A | 6/1998 | Ruelke | |
| 5,903,820 A | 5/1999 | Hagstrom | |
| 6,020,795 A | 2/2000 | Kim | |
| 6,078,299 A | 6/2000 | Scharfe, Jr. | |
| 6,108,527 A | 8/2000 | Urban et al. | |
| 6,329,880 B2 | 12/2001 | Akiya | |
| 6,496,708 B1 | 12/2002 | Chan et al. | |
| 6,559,740 B1* | 5/2003 | Schulz | H01P 1/2053 333/202 |
| 6,771,141 B2 | 8/2004 | Iida et al. | |
| 6,972,640 B2 | 12/2005 | Nagamori et al. | |
| 7,042,309 B2 | 5/2006 | Podell | |
| 7,230,316 B2 | 6/2007 | Yamazaki et al. | |
| 7,236,069 B2* | 6/2007 | Puoskari | H01P 1/2053 333/202 |
| 7,305,223 B2 | 12/2007 | Liu et al. | |
| 7,319,370 B2 | 1/2008 | Napijalo | |
| 7,336,142 B2 | 2/2008 | Vogel | |
| 7,493,093 B2 | 2/2009 | Boerman et al. | |
| 7,538,635 B2 | 5/2009 | Fukuda et al. | |
| 7,546,089 B2 | 6/2009 | Bellantoni | |
| 7,966,140 B1 | 6/2011 | Gholson, III et al. | |
| 7,973,358 B2* | 7/2011 | Hanke | H01P 5/18 257/335 |
| 8,115,234 B2* | 2/2012 | Nakajima | H01L 27/0207 257/194 |
| 8,175,554 B2 | 5/2012 | Camuffo et al. | |
| 8,248,302 B2 | 8/2012 | Tsai et al. | |
| 8,289,102 B2 | 10/2012 | Yamamoto et al. | |
| 8,315,576 B2 | 11/2012 | Jones | |
| 8,334,580 B2* | 12/2012 | Sakurai | H01L 23/66 257/508 |
| 8,417,196 B2 | 4/2013 | Kitching et al. | |
| 8,526,890 B1 | 9/2013 | Chien et al. | |
| 8,606,198 B1 | 12/2013 | Wright | |
| 8,633,761 B2* | 1/2014 | Lee | H03F 1/56 327/108 |
| 8,761,026 B1* | 6/2014 | Berry | H01P 5/12 327/403 |
| 8,810,331 B2* | 8/2014 | Gu | H03H 7/0153 333/17.1 |
| 9,014,647 B2 | 4/2015 | Kitching et al. | |
| 9,214,967 B2 | 12/2015 | Reisner et al. | |
| 9,356,330 B1 | 5/2016 | Donoghue et al. | |
| 9,425,835 B2* | 8/2016 | Seckin | H04B 1/0475 |
| 9,496,902 B2* | 11/2016 | Srirattana | H04B 1/40 |
| 9,553,617 B2* | 1/2017 | Srirattana | H04B 1/40 |
| 9,634,371 B2* | 4/2017 | Swarup | H01P 5/028 |
| 9,755,670 B2* | 9/2017 | Chen | H04B 1/04 |
| 2002/0097100 A1* | 7/2002 | Woods | H03B 5/1876 331/99 |
| 2002/0113666 A1 | 8/2002 | Yamazaki et al. | |
| 2002/0139975 A1 | 10/2002 | Lewis et al. | |
| 2003/0214365 A1 | 11/2003 | Adar et al. | |
| 2004/0127178 A1 | 7/2004 | Kuffner | |
| 2004/0201526 A1* | 10/2004 | Knowles | H01Q 1/38 343/700 MS |
| 2005/0017821 A1 | 1/2005 | Sawicki | |
| 2005/0040912 A1 | 2/2005 | Pelz | |
| 2005/0146394 A1 | 7/2005 | Podell | |
| 2005/0170794 A1 | 8/2005 | Koukkari et al. | |
| 2005/0239421 A1 | 10/2005 | Kim et al. | |
| 2006/0232359 A1 | 10/2006 | Fukuda et al. | |
| 2007/0082642 A1* | 4/2007 | Hattori | H03H 9/542 455/286 |
| 2007/0159268 A1 | 7/2007 | Podell | |
| 2008/0036554 A1 | 2/2008 | Krausse et al. | |
| 2008/0055187 A1* | 3/2008 | Tamura | H01P 1/15 343/876 |
| 2008/0056638 A1 | 3/2008 | Glebov et al. | |
| 2008/0070519 A1 | 3/2008 | Okabe | |
| 2008/0112466 A1 | 5/2008 | Sasaki | |
| 2009/0134953 A1 | 5/2009 | Hunt et al. | |
| 2009/0195335 A1 | 8/2009 | Wahl et al. | |
| 2009/0278624 A1 | 11/2009 | Tsai et al. | |
| 2009/0280755 A1 | 11/2009 | Camuffo et al. | |
| 2009/0322313 A1 | 12/2009 | Zhang et al. | |
| 2011/0057746 A1 | 3/2011 | Yamamoto et al. | |
| 2011/0063044 A1 | 3/2011 | Jones | |
| 2011/0148548 A1* | 6/2011 | Uhm | H01P 1/20345 333/205 |
| 2011/0199166 A1 | 8/2011 | Carrillo-Ramirez | |
| 2011/0254637 A1* | 10/2011 | Manssen | H03H 7/40 333/2 |
| 2011/0279192 A1 | 11/2011 | Nash et al. | |
| 2011/0298559 A1 | 12/2011 | Kitching et al. | |
| 2012/0019332 A1 | 1/2012 | Hino et al. | |
| 2012/0019335 A1 | 1/2012 | Hoang et al. | |
| 2012/0062333 A1 | 3/2012 | Ezzeddine et al. | |
| 2012/0071123 A1 | 3/2012 | Jones et al. | |
| 2012/0243579 A1 | 9/2012 | Premakanthan et al. | |
| 2013/0005284 A1 | 1/2013 | Dalipi | |
| 2013/0113575 A1 | 5/2013 | Easter | |
| 2013/0194054 A1 | 8/2013 | Presti | |
| 2013/0207741 A1 | 8/2013 | Presti | |
| 2013/0241668 A1 | 9/2013 | Tokuda et al. | |
| 2013/0293316 A1 | 11/2013 | Kitching et al. | |
| 2013/0307635 A1 | 11/2013 | Kase et al. | |
| 2014/0152253 A1* | 6/2014 | Ozaki | H02J 5/005 320/108 |
| 2014/0266499 A1 | 9/2014 | Noe | |
| 2014/0368293 A1 | 12/2014 | Mumiyama | |
| 2015/0002239 A1 | 1/2015 | Tanaka | |
| 2015/0042412 A1* | 2/2015 | Imbornone | H01P 5/18 333/112 |
| 2015/0043669 A1 | 2/2015 | Ella et al. | |
| 2015/0048910 A1 | 2/2015 | LaFountain et al. | |
| 2015/0091668 A1 | 4/2015 | Solomko et al. | |
| 2015/0200437 A1 | 7/2015 | Solomko et al. | |
| 2015/0249485 A1* | 9/2015 | Ouyang | H04B 5/0081 455/41.1 |
| 2015/0270821 A1 | 9/2015 | Natarajan et al. | |
| 2015/0326202 A1* | 11/2015 | Nicholls | H04B 1/006 327/553 |
| 2015/0349742 A1 | 12/2015 | Chen et al. | |
| 2015/0372366 A1 | 12/2015 | Frye | |
| 2016/0025928 A1 | 1/2016 | Onawa | |
| 2016/0028147 A1 | 1/2016 | Srirattana et al. | |
| 2016/0028420 A1 | 1/2016 | Srirattana et al. | |
| 2016/0043458 A1 | 2/2016 | Sun et al. | |
| 2016/0065167 A1 | 3/2016 | Granger-Jones et al. | |
| 2016/0079649 A1 | 3/2016 | Ilkov et al. | |
| 2016/0079650 A1 | 3/2016 | Solomko et al. | |
| 2016/0172737 A1 | 6/2016 | Srirattana et al. | |
| 2016/0172738 A1 | 6/2016 | Srirattana et al. | |
| 2016/0172739 A1 | 6/2016 | Srirattana et al. | |
| 2016/0172740 A1 | 6/2016 | Srirattana et al. | |
| 2016/0268994 A1 | 9/2016 | Granger-Jones et al. | |
| 2016/0344430 A1 | 11/2016 | Srirattana et al. | |
| 2016/0344431 A1 | 11/2016 | Srirattana et al. | |
| 2017/0033428 A1 | 2/2017 | Ootsuka et al. | |
| 2017/0063425 A1 | 3/2017 | Khlat et al. | |
| 2017/0085245 A1 | 3/2017 | Srirattana et al. | |

FOREIGN PATENT DOCUMENTS

| | | |
|---|---|---|
| JP | 2000-077915 A | 3/2000 |
| JP | 2001127664 A | 5/2001 |
| JP | 2013126067 A | 6/2013 |
| KR | 20040037465 A | 5/2004 |
| KR | 20110118289 A | 10/2011 |
| KR | 20120007790 A | 1/2012 |
| WO | 2005018451 A1 | 3/2005 |

(56) References Cited

FOREIGN PATENT DOCUMENTS

| | | |
|---|---|---|
| WO | 2015020927 A2 | 2/2015 |
| WO | 2015134979 A1 | 9/2015 |

* cited by examiner

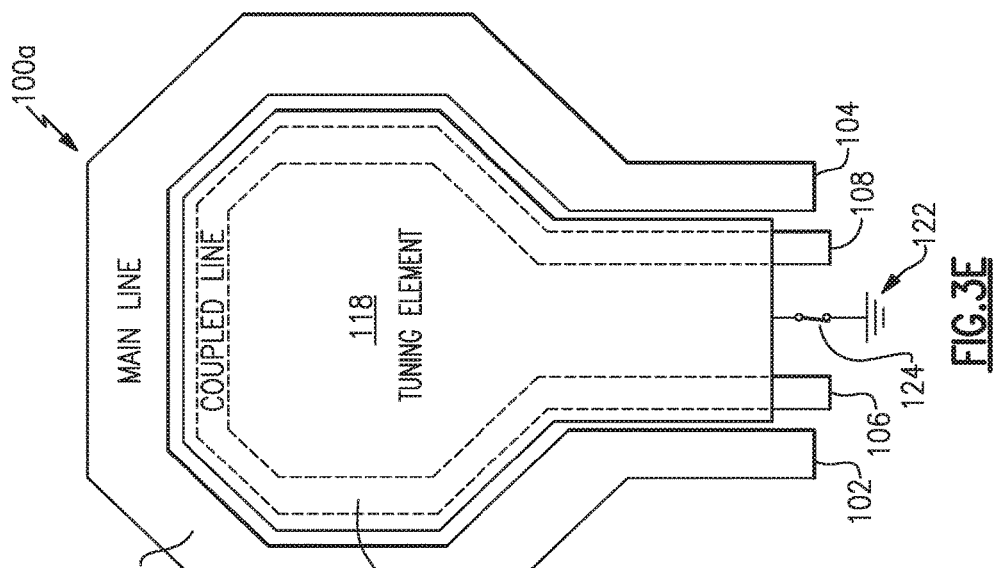
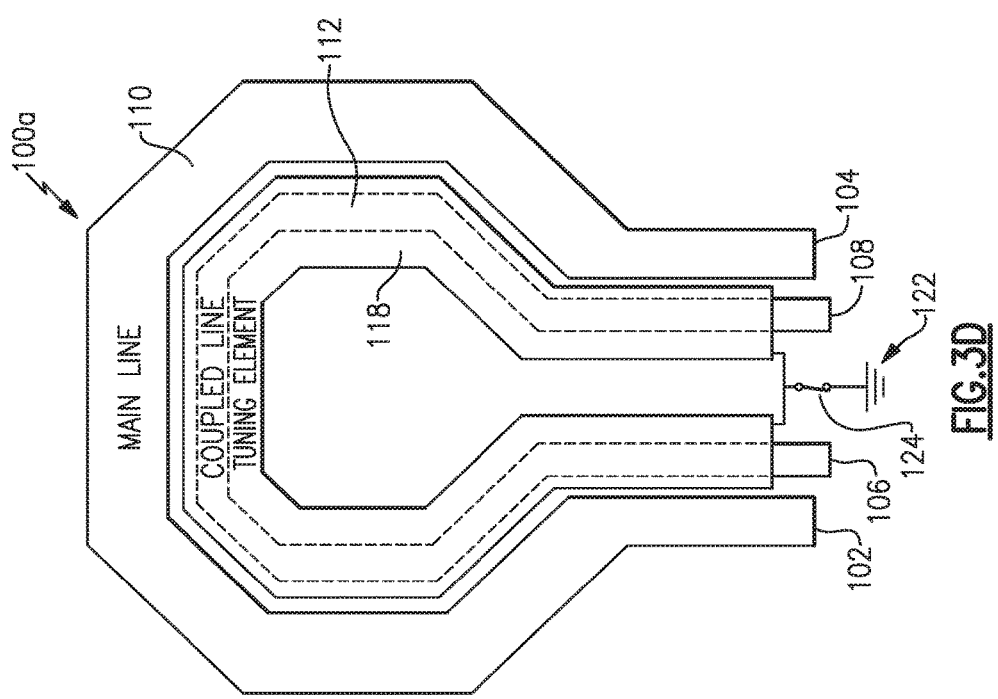

COMPENSATED ELECTROMAGNETIC COUPLER

CROSS REFERENCE TO RELATED APPLICATIONS

This application claims the benefit under 35 U.S.C. § 119(e) and PCT Article 8 to U.S. Provisional Patent Application No. 62/329,385 filed on Apr. 29, 2016, and to U.S. Provisional Patent Application No. 62/463,010 filed on Feb. 24, 2017, each of which is incorporated herein by reference in its entirety for all purposes.

BACKGROUND

Directional couplers are widely used in front end module (FEM) products, such as in radio transceivers, wireless handsets, and the like. For example, a directional coupler can be used to detect and monitor electromagnetic (EM) output power. When a radio frequency (RF) signal generated by an RF source is provided to a load, such as to an antenna, a portion of the RF signal can be reflected back from the load. An EM coupler can be included in a signal path between the RF source and the load to provide an indication of forward RF power of the RF signal traveling from the RF source to the load and/or an indication of reverse RF power reflected back from the load. EM couplers include, for example, directional couplers, bi-directional couplers, multi-band couplers (e.g., dual band couplers), and the like.

Referring to FIG. 1, an EM coupler 100 typically has a power input port 102, a power output port 104, a coupled port 106, and an isolation port 108. The electromagnetic coupling mechanism, which can include inductive or capacitive coupling, is typically provided by two parallel or overlapped transmission lines, such as microstrips, strip lines, coplanar lines, and the like. A main transmission line 110 extends between the power input port 102 and the power output port 104 and provides the majority of the signal 116 from the power input port 102 to the power output port 104. A coupled line 112 extends between the coupled port 106 and the isolation port 108 and may extract a portion 114 of the power traveling between the power input port 102 and the power output port 104 for various purposes, including various measurements. When a termination impedance is presented to the isolation port 108, an indication of forward RF power traveling from the power input port 102 to the power output port 104 is provided at the coupled port 106.

In a forward coupling mode, as in FIG. 1, the portion 114 is a fraction of the main signal 116 RF power traveling from the power input port 102 to the power output port 104. EM couplers are typically rated by their coupling factor, usually stated in decibels, which is a measure of the ratio of the power of the portion 114 coupled from the power of the input signal 116. For example, a 20 dB coupler will provide a coupled signal, e.g., a portion 114, that is 20 dB lower than the input power, or about 1% of the input power.

It is generally desirable to have a relatively low coupling factor to not overly remove power from the main signal, but it is also desirable for the coupling factor to be certain and consistent, to allow accurate assessments of the power of the main signal. Process variations during manufacture of the coupler may influence the coupling factor, and may result in couplers that have significant variation in the coupling factor.

SUMMARY OF INVENTION

Aspects and embodiments are directed to electromagnetic couplers having structures designed to compensate for the impact of manufacturing process variations on coupler parameters and performance. As discussed in more detail below, various components and features may be combined from transmission lines to form compensated electromagnetic couplers, which may be further combined with various components and features to form modules, devices, and systems. Compensated electromagnetic couplers may compensate for process variations during manufacturing to offer more consistent coupling factors and higher manufacturing yields.

According to one embodiment, an electromagnetic coupler comprises a dielectric layer having a first surface and a second surface; a first transmission line disposed on the first surface of the dielectric layer and extending between an input port and an output port; a second transmission line disposed on the second surface of the dielectric layer and extending between a coupled port and an isolation port, the electromagnetic coupler being configured to provide a coupled signal at the coupled port responsive to receiving an input signal at the input port, an amplitude of the coupled signal being related to an amplitude of the input signal by a coupling factor; and a tuning element disposed on the first surface of the dielectric layer and configured to stabilize the coupling factor over a range of variations in a thickness of the dielectric layer.

In one example electromagnetic coupler the tuning element is short circuited to an electrical ground. In one example the tuning element is connected to ground through an impedance. In one example the impedance is adjustable. In one example the tuning element is configured to be selectively decoupled from the first transmission line and the second transmission line.

In one example electromagnetic coupler the second transmission line is laterally offset from the first transmission line. In one example the second transmission line is laterally offset from the tuning element. In one example a portion of the second transmission line forms an overlapping region with at least one of the first transmission line and the tuning element.

In another example, the electromagnetic coupler may be part of a module, a wireless device, or another form of electronic device or system. In one example, the system or device includes a transceiver. In one example the system or device includes an antenna to transmit a transmit signal and/or receive a receive signal. In one example the system or device includes an antenna switch module connected to either the input port or the output port of the electromagnetic coupler and is configured to direct signals between the electromagnetic coupler and a transceiver or an antenna, or both. In one example the system or device includes a power amplifier connected between a transceiver and an antenna switch module, the power amplifier being configured to receive and amplify the transmit signal. In one example the system or device may further include a sensor module, a memory, a baseband sub-system, a user interface, and/or a battery.

According to another embodiment, a method of manufacturing an electromagnetic coupler having features to stabilize a coupling factor of the electromagnetic coupler and to compensate for manufacturing process variations comprises providing a dielectric layer; forming a first transmission line on a first surface of the dielectric layer, the first transmission line extending between an input port and an output port of the electromagnetic coupler; forming a second transmission line on a second surface of the dielectric layer such that the dielectric layer is positioned between the first and second transmission lines, the second transmission line extending between a coupled port and an isolation port of the electromagnetic coupler, the second transmission line oriented with respect to the first transmission line such that the electromagnetic coupler provides a coupled signal at the coupled port responsive to receiving an input signal at the input port and having a terminating impedance connected to the isolation port; and providing a tuning element configured to stabilize the coupling factor over a range of thickness of the dielectric material.

In one example the method includes providing an electrical ground connection to the tuning element. In one example the method includes providing a switching element configured to selectively connect the tuning element to the electrical ground.

In yet another embodiment, a method of stabilizing a coupling factor of an electromagnetic coupler over a range of manufacturing process variations comprises providing the electromagnetic coupler, including a first transmission line disposed on a first surface of a dielectric layer and extending between an input port and an output port and a second transmission line disposed on a second surface of the dielectric layer and extending between a coupled port and an isolation port, the electromagnetic coupler being configured to provide a coupled signal at the coupled port responsive to receiving an input signal at the input port, an amplitude of the coupled signal being related to an amplitude of the input signal by the coupling factor; and providing a tuning element configured to stabilize the coupling factor over a range of thickness of the dielectric layer.

In one example the method includes selectively connecting the tuning element to an electrical ground. In one example the method includes selectively grounding the tuning element via an adjustable impedance. In one example the method includes measuring the coupling factor and adjusting the impedance to maintain the coupling factor within a predetermined range of values.

According to another embodiment, an electromagnetic coupler comprises a multi-layer dielectric substrate including a plurality of substrate layers each having a range of variation in thickness; a main transmission line disposed on a first surface among the plurality of substrate layers and extending between an input port and an output port; a coupled line disposed on a second surface among the plurality of substrate layers and extending between a coupled port and an isolation port, the electromagnetic coupler being configured to present a coupled signal at the coupled port responsive to receiving an input signal at the input port, an amplitude of the coupled signal being related to an amplitude of the input signal by a coupling factor, the main transmission line and the coupled line being separated from one another by at least one substrate layer among the plurality of substrate layers; and a tuning element disposed on the first surface and configured to stabilize a coupling factor over a range of variations in a thickness of the at least one substrate layer.

In one example the tuning element is short circuited to an electrical ground. In one example the tuning element is connected to ground through an impedance. In one example the impedance is adjustable. In one example the tuning element is configured to be selectively decoupled from the main transmission line and the coupled line.

In one example the coupled line is laterally offset from the main transmission line. In one example the coupled line is laterally offset from the tuning element. In one example a portion of the coupled line forms an overlapping region with the main transmission line and/or the tuning element.

In another example, the electromagnetic coupler may be part of a module, a wireless device, or another form of electronic device or system. In one example, the system or device includes a transceiver. In one example the system or device includes an antenna to transmit a transmit signal and/or receive a receive signal. In one example the system or device includes an antenna switch module connected to either the input port or the output port of the electromagnetic coupler and is configured to direct signals between the electromagnetic coupler and a transceiver or an antenna, or both. In one example the system or device includes a power amplifier connected between a transceiver and an antenna switch module, the power amplifier being configured to receive and amplify the transmit signal. In one example the system or device may further include a sensor module, a memory, a baseband sub-system, a user interface, and/or a battery.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 3D is a top view schematic diagram of an alternative example of a compensated coupler;

FIG. 3E is a top view schematic diagram of an alternative example of a compensated coupler;

DETAILED DESCRIPTION

Traditional multi-layer coupler designs, either implemented in laminate manufacturing processes or semiconductor manufacturing processes, are subjected to process variation. For example, variation in dielectric thickness between metal layers that form a main transmission line and a coupled line can result in performance variation, such as variation in coupling factor caused by the effect of varying thickness on capacitive coupling and inductive coupling between the two lines.

Figure 1:
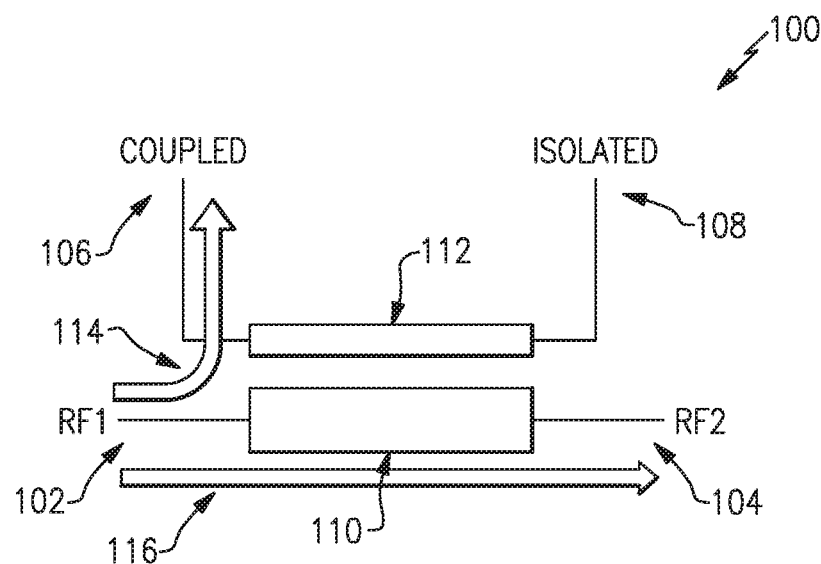
FIG. 1 is a diagram of one example of an electromagnetic coupler.
Figure 2:
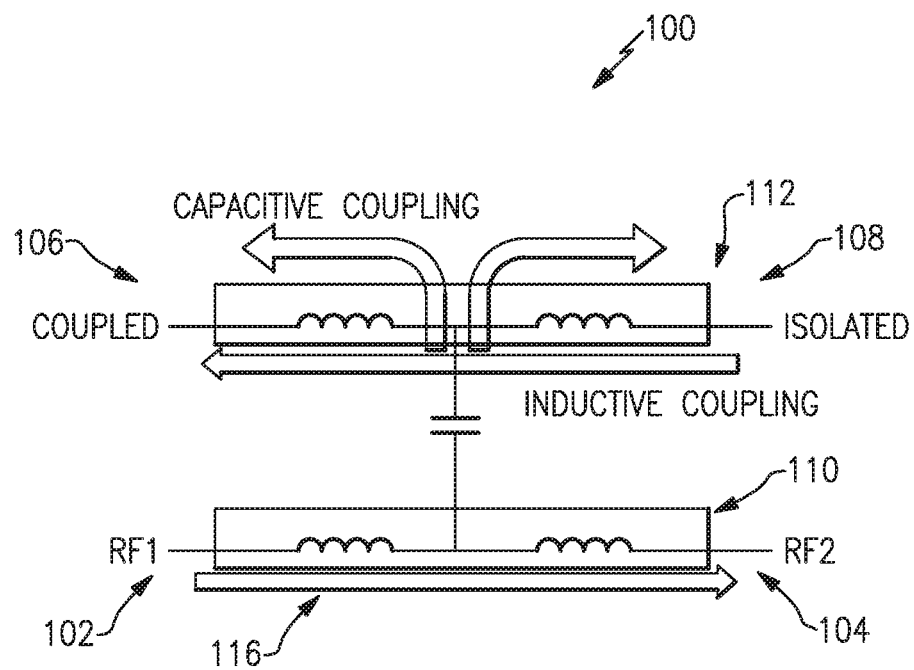
FIG. 2 is an illustration of a theory of coupling.

This effect is explained with reference to FIG. 2, which shows the power input port 102, the power output port 104, the coupled port 106, and the isolation port 108. The main transmission line 110 and the coupled line 112 may be considered to be inductors, and there is an inductive coupling between them due to their proximity to one another. Additionally, the proximity of the coupled line 112 to the main transmission line 110 forms a capacitor, such that there is also a capacitive coupling between the two lines. Both forms of coupling, inductive and capacitive, vary with proximity between the main transmission line 110 and the coupled line 112. Accordingly, the coupling factor of an EM coupler will vary if the proximity between the main transmission line and the coupled line changes. Modern transmission line couplers may be manufactured using laminate and/or semiconductor techniques, and the transmission lines may be separated from each other by a layer of dielectric material. The process of laminating or depositing the dielectric material may result in dielectric thickness that may be different from one coupler to the next, or even within a single coupler.

Coupling factor variation due to process variations is difficult to control. In particular, it can be difficult to correct for dielectric thickness variation. Conventionally, stringent controls and tolerances have been required on the manufacturing processes, or testing is needed to perform the screening of dielectric (for example, cross sectioning and measuring for acceptable dielectric thickness, i.e., within tolerance) or post-manufacturing screening of coupling factor performance. This usually leads to higher cost and longer manufacturing or testing time.

Aspects and embodiments provide a coupler that includes additional elements to compensate for coupling factor variation. The coupling factor variation may be due to variation in spacing between the main transmission line and coupled line, such as by variation in dielectric thickness between the lines, spacing between the metal traces forming the lines, or variation in the line widths and heights, all brought about by variations during the manufacturing processes. Consistency in coupling factor is desirable because the coupled signal may be used to determine the power of the main signal, and thus the ratio of the coupled signal to the main signal, i.e., the coupling factor, needs to be well-known and consistent to meet challenging performance specifications. In mobile phone applications, the ability to accurately monitor and control signal power can be critical. As devices and components get ever smaller in size, variations brought in by the manufacturing process (referred to herein as process variations) may become ever more significant. In traditional coupler designs and manufacturing, variation in dielectric thickness could cause 25% or more variation in the coupling factor. Embodiments of the EM couplers disclosed herein include additional components acting as tuning stubs to counteract coupling factor variation, thereby improving coupling factor consistency in light of process variation, leading to lower costs and higher yields of suitable EM couplers.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

According to certain embodiments, in an EM coupler, a coupled line may be positioned in various orientations relative to a main transmission line. One or more additional traces or transmission lines may be positioned to affect the coupling between the main transmission line and the coupled line in a manner that will tend to counteract the influence of process variation on the coupling factor, thus yielding manufactured EM couplers having lower variation in coupling factor than is available from conventional coupler designs.

Figure 3A:
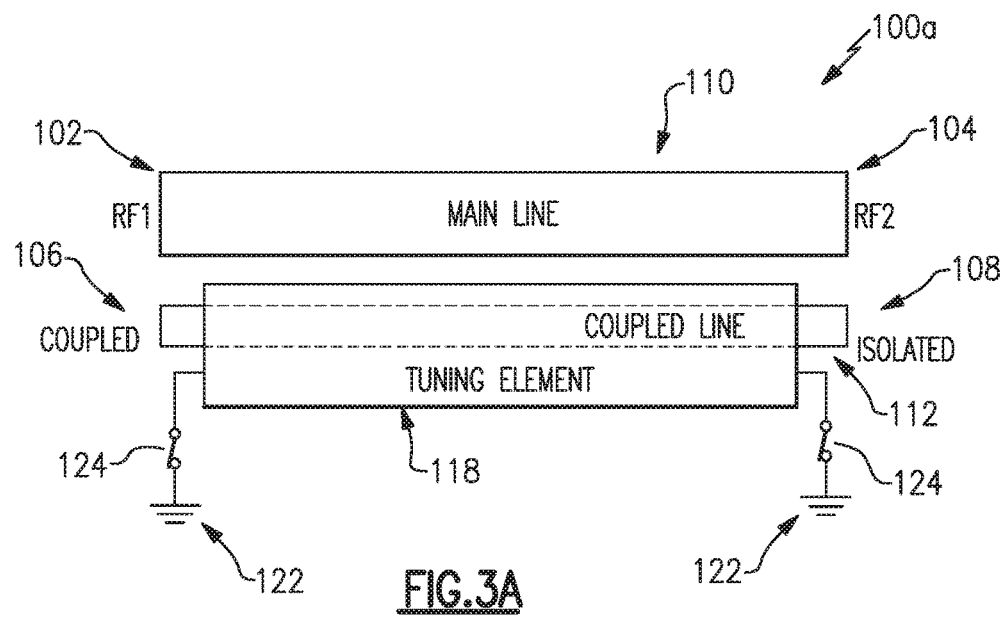
FIG. 3A is a top view schematic diagram of an example of a compensated coupler.
Figure 3B:
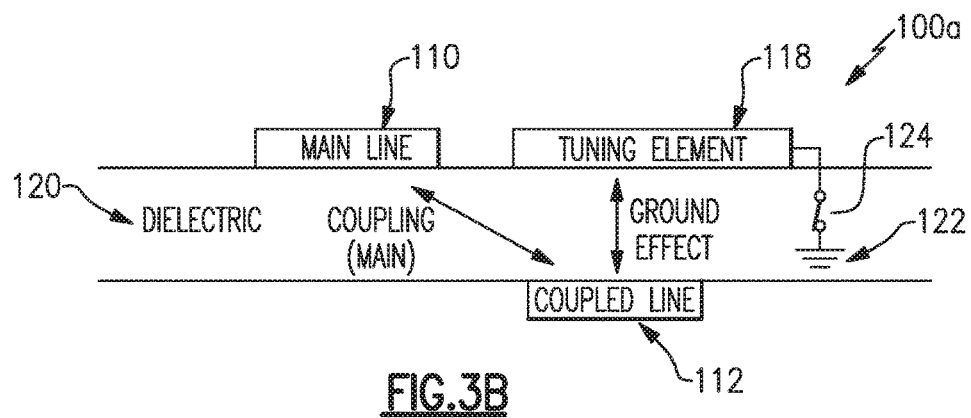
FIG. 3B is an end view schematic diagram of the compensated coupler of FIG. 3A.

Various examples of such an arrangement are shown in FIGS. 3A-3E. FIG. 3A is a top schematic view of the main transmission line 110, the coupled line 112, and a tuning element 118. FIG. 3B is a corresponding end view of the transmission lines shown in FIG. 3A. In this example, the tuning element 118 is in the same plane with the main transmission line 110, and the coupled line 112 is located in a different plane below (or above) the tuning element 118, separated by a dielectric material 120 and offset from the main transmission line 110. In an alternative example, shown in FIG. 3C, the tuning element 118 may be in the same plane with the coupled line 112, and the main transmission line 110 may be located in a different plane below (or above) the tuning element 118, separated by the dielectric material 120 and offset from the coupled line 112.

The transmission lines 110, 112, tuning element 118, and the dielectric material 120 may be manufactured by a laminating process or a deposition and etching process, for example. As may be seen in FIGS. 3B and 3C, thickness of the dielectric material 120 can determine the spacing, or distance, between the first plane and the second plane, and therefore between the tuning element 118 and either the coupled line 112 or the main transmission line 110. This spacing affects the capacitive and inductive coupling among the lines, and variations in the dielectric thickness cause variation in the coupling factor.

Figure 3C:
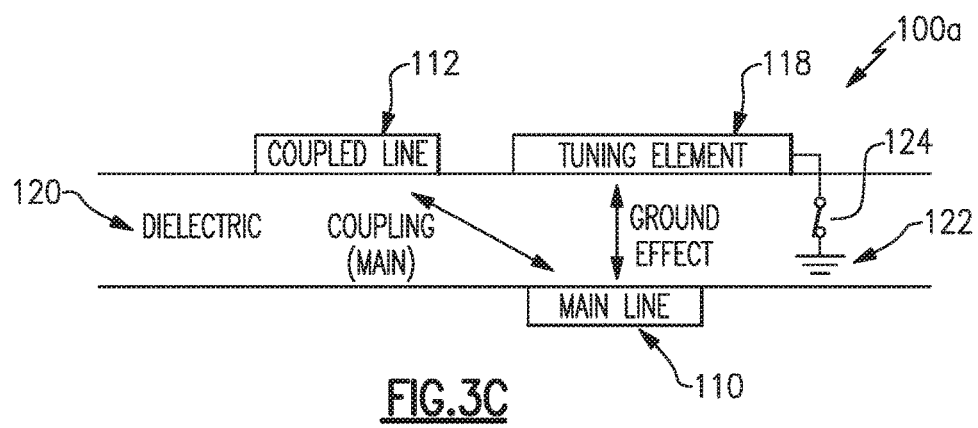
FIG. 3C is an end view schematic diagram of an alternative example of a compensated coupler.

In the examples illustrated in FIGS. 3A-3C, during the manufacturing process there may be variations in the thickness of the dielectric material 120. One coupler may have a dielectric material 120 thicker than another coupler manufactured using the same process or equipment, or vice versa. An exemplary thickness of the dielectric material is 42 micrometers (μm or microns), and may typically vary by 5% or 10%. An exemplary range of resulting thickness may be from 38 μm to 46 μm for a nominal intended thickness of 42 μm.

In a particular instance, if the manufacturing process creates less than nominal thickness, the coupled line 112 will be closer to the main transmission line 110 than nominally designed. In such a case, the coupling between the coupled line 112 and the main transmission line 110 in a traditional coupler will be greater and will result in a higher coupling factor than intended, as discussed above with reference to FIG. 2.

In embodiments disclosed herein, however, a tuning element 118 acts against the increased coupling, stabilizing the coupling factor with respect to process variations. The examples of FIGS. 3A-3C include a grounding 122 whereby the tuning element 118 is grounded at each end, forming a partial ground plane and creating a ground effect with the coupled line 112 and/or the main transmission line 110. In the example of FIG. 3B, a reduced dielectric thickness will bring the coupled line 112 in closer proximity to both the main transmission line 110 and the tuning element 118. The closer proximity to the main transmission line 110 will tend to increase the EM coupling, as discussed above, but the closer proximity to the grounded tuning element 118 will have the opposite effect. The two effects counter each other and yield a more consistent coupling factor when process variation causes the dielectric thickness to be thinner.

In a similar manner, still with reference to the example of FIG. 3B, an increased dielectric thickness due to process variation will result in the coupled line 112 being further from each of the main transmission line 110 and the tuning element 118. The effect of the coupled line 112 being further from the main transmission line 110 is to reduce coupling, while the effect of the coupled line 112 being further from the tuning element 118 is to increase coupling as the ground effect is lessened. These two effects tend to negate each other and maintain a more consistent coupling factor when process variation causes the dielectric thickness to be greater. The effect of the tuning element 118 with grounding 122 is to shunt some coupled power to ground. The tuning element 118 shunts more coupled power to ground when it is in closer proximity to the other elements, i.e., the main transmission line 110 and the coupled line 112, and shunts less coupled power to ground when farther away.

The example embodiments of FIGS. 3A-3C also include a ground switch 124 at each grounding 122 to allow selective decoupling of the tuning element 118 from ground. Certain embodiments may include a fixed connection to ground the tuning element 118 but alternate embodiments may include one or more ground switches 124 to selectively decouple the tuning element 118 from a ground connection. Alternate embodiments may also include switches 124 to selectively connect the tuning element 118 to alternate nodes, reference voltages, or otherwise. In embodiments including one or more switches 124 the tuning element 118 may be selectively removed from operation, thereby removing the compensating effect of the tuning element 118, in cases when it may not be needed. Accordingly, the groundings 122 may be switched 124 in certain embodiments. Additionally, the groundings 122 may be located at differing positions in various embodiments. For example, while the groundings 122 in FIGS. 3A-3C are shown to connect the ends of the tuning element 118 to ground, alternate embodiments may include groundings 122 at additional or alternate positions, such as along the length of the tuning element 118, and may be coupled to the tuning element 118 at the sides, middle, or elsewhere.

In the example embodiment of FIG. 3B, the coupled line 112 is substantially below the tuning element 118 and offset from the main transmission line 110. In other embodiments, the coupled line 112 may be substantially below the main transmission line 110 and offset from the tuning element 118, or the coupled line 112 may be offset from each of the main transmission line 110 and the tuning element 118, or the transmission lines may be otherwise oriented to each other in any number of ways. Additionally, it will be understood that the main transmission line 110, the coupled line 112, and the tuning element 118 may have various shapes and may be constructed of various materials. The main transmission line 110 and the coupled line 112 may be formed of a conductor, such as a metal, and the tuning element 118 may also be formed of a conductor, but may alternately be formed of a semiconductor or other material selected based upon its influence on coupling factor, e.g., to decrease coupling between the main transmission line 110 and the coupled line 112 when a decreased thickness tends to increase the coupling.

As discussed above, any of the main transmission line 110, the coupled line 112, and the tuning element 118 may have various shapes and, in particular, need not be straight lines nor be limited to a particular plane. Additionally, numerous variations may be made to influence coupling factor and to optimize the compensating effect of the tuning element 118, including but not limited to, material, geometry (width, length, shape, etc.), position, and the like of any of the main transmission line 110, the coupled line 112, and the tuning element 118.

Any physical arrangement of main transmission line 110, coupled line 112, and tuning element 118 suitable to perform or function in a compensating manner for process variation, as described herein, may be included in various embodiments. For example, FIGS. 3D and 3E illustrate alternative physical arrangements of the main transmission line 110, the coupled line 112, and the tuning element 118. FIGS. 3D and 3E each illustrate a main transmission line 110 implemented as a loop, with a coupled line 112 implemented as a loop adjacent to the main transmission line 110 and, in this example, in a different plane from the main transmission line 110, e.g., on a different layer with a dielectric in between. The example of FIG. 3D includes a tuning element 118 in the form of a loop in the same plane as the main transmission line 110 with ends selectively switched 124 to a grounding 122. The example of FIG. 3E includes a tuning element 118 in the form of a ground plane, also selectively switched 124 to a grounding 122. Alternate embodiments include numerous variations in physical structure, materials, and arrangement of the main transmission line 110, coupled line 112, and tuning element 118.

Figure 4:
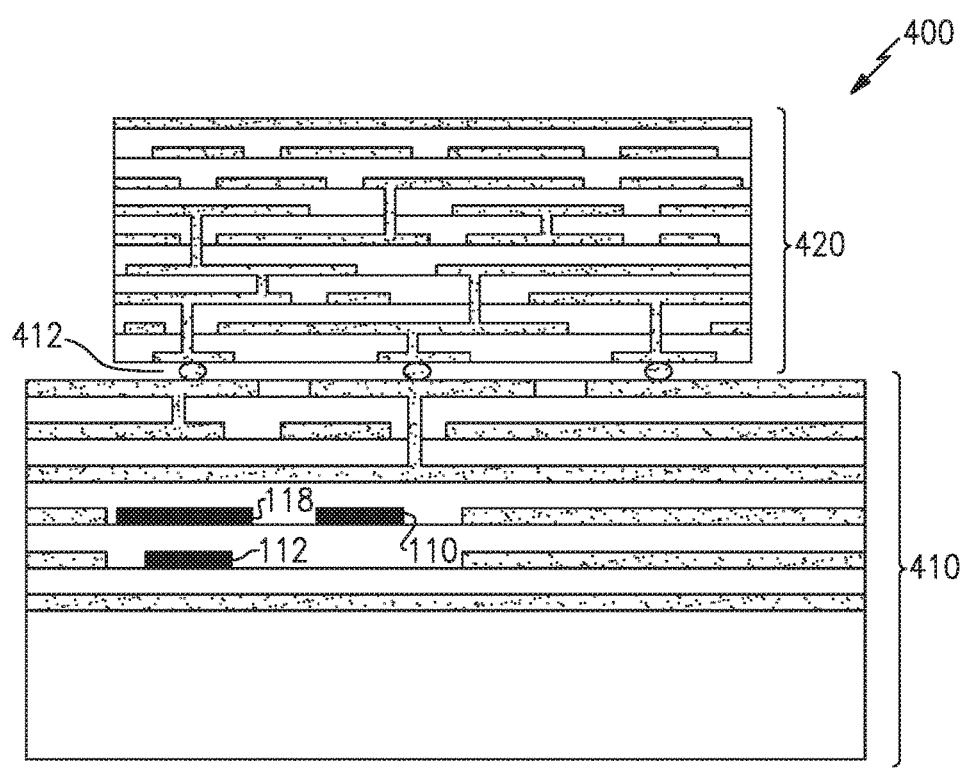
FIG. 4 is a side view schematic diagram of a layout of an example compensated coupler.

While FIGS. 3A-3E illustrate various physical shapes and arrangements of the main transmission line 110, coupled line 112, and tuning element 118 relative to each other, FIG. 4 illustrates an example of locations for these elements within a stackup 400. FIG. 4 illustrates some aspects of an example construction of any of the EM couplers described herein. The example of FIG. 4 includes a circuit stackup 400 that includes a laminate substrate 410 and a die 420 mounted on and electrically connected to the laminate substrate 410 via solder bumps 412. The substrate 410 and the die 420 are each made up of multiple layers of conducting (e.g., metal) or semiconducting materials separated by dielectric, with interconnections between layers through conductive vias. In various embodiments, the die 420 may be electrically connected to the substrate 410 by other arrangements, such as pins, sockets, pads, balls, lands, etc. Other embodiments may include only a laminate substrate 410 and no die 420.

In the example of FIG. 4, the main and coupled line sections of the EM coupler are implemented within the layers of the substrate 410. FIG. 4 shows an "end view" of the main transmission line 110 and the coupled line 112 in that the extent of their length may be perpendicular to the plane of the image. As shown, the coupled line 112 is formed on a layer below and offset from the main transmission line 110, and below and in proximity to the tuning element 118, similar to the arrangement of FIG. 3B. In embodiments and as shown in FIG. 4, the tuning element 118 may be in the same layer as, and adjacent to, the main transmission line 110. As discussed above, the main transmission line 110 and the coupled line 112 may be exchanged in the figure, or other physical arrangements of the elements relative to each other may be suitable. Also as discussed above, in certain embodiments, any of the main transmission line 110, coupled line 112, or tuning element 118 may include curved or angled sections and may not be straight. Additionally, the main transmission line 110, coupled line 112, and tuning element 118 may be implemented in one or more layers of either the substrate 410 or the die 420. Additionally, while the stackup 400 has been described as a substrate 410 and a die 420, the stackup 400 could equivalently be described as a circuit board (e.g., 410) and a substrate (e.g., 420), or a stackup may have multiple and/or additional layered structures. For example, a multi-chip module may have a substrate and multiple dies, and a device may include a circuit board having one or more multi-chip modules mounted thereto. The main transmission line 110, coupled line 112, and tuning element 118 of any of the EM couplers described herein may be implemented among or across multiple layers of various structures.

Additionally, switches, groundings, filters, impedances, control circuitry, communication interfaces, and memory, as well as other components, may also be implemented within a stackup at one or more layers of a circuit board, a substrate, or a die, or may be distributed among the various layers or may be external to a stackup, or any combination of these.

While a dielectric thickness of 42 µm has been presented above as an exemplary thickness, other embodiments may include other nominal thicknesses and the criteria for nominal thicknesses may depend upon changing operational parameters or applications, such as frequency, frequency bands, and desired coupling factors.

Figure 5A:
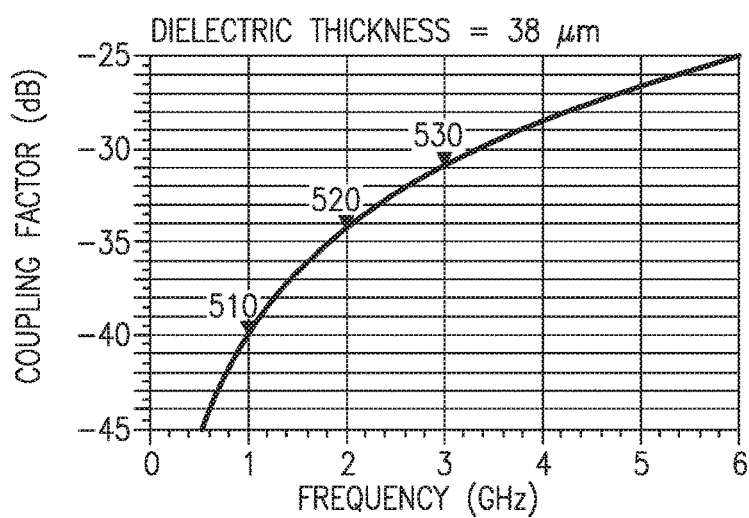
FIG. 5A is a graph of coupling factors across a range of frequencies for an uncompensated coupler for a dielectric thickness less than a nominal thickness.
Figure 5B:
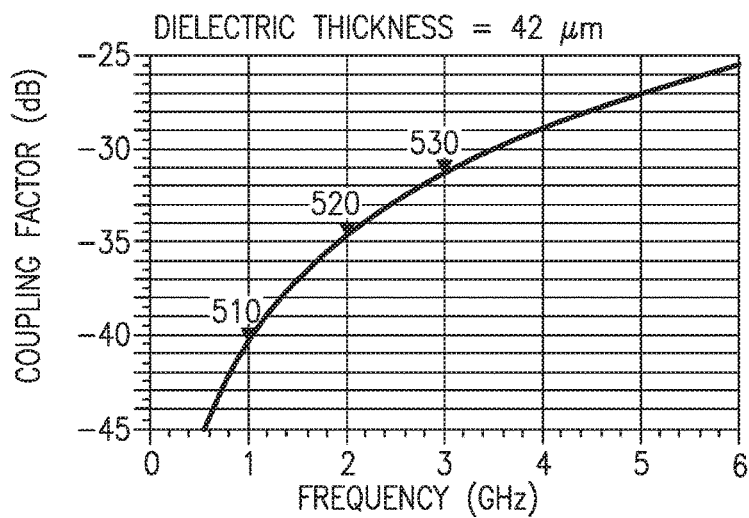
FIG. 5B is a graph of coupling factors across a range of frequencies for an uncompensated coupler for a nominal dielectric thickness.
Figure 5C:
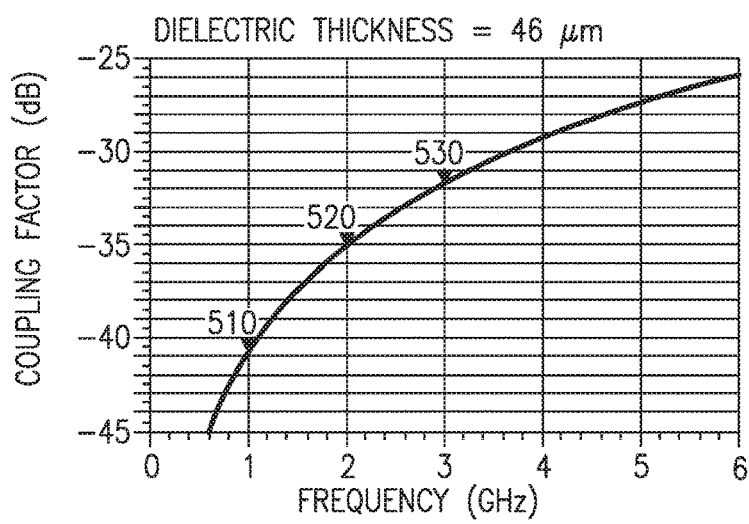
FIG. 5C is a graph of coupling factors across a range of frequencies for an uncompensated coupler for a dielectric thickness greater than a nominal thickness.

Simulated performance of a particular coupler design without the benefit of the tuning element disclosed herein is shown in FIGS. 5A to 5C. Each of FIGS. 5A to 5C shows a graph of coupling factor on the Y-axis across a range of frequencies on the X-axis. FIG. 5A shows the results for a "thin" dielectric thickness of 38 µm, thinner than the nominal thickness of 42 µm for this example. FIG. 5B shows the results for the nominal dielectric thickness of 42 µm. FIG. 5C shows the results for a thicker dielectric thickness of 46 µm. In each of FIGS. 5A to 5C, reference numeral 510 corresponds to the coupling factor at a frequency of 1 GHz, reference numeral 520 corresponds to the coupling factor at a frequency of 2 GHz, and reference numeral 530 corresponds to the coupling factor at a frequency of 3 GHz. The coupling factor at these specific frequencies of 1 GHz, 2 GHz, and 3 GHz, across varying dielectric thicknesses, are tabulated in Table 1, in decibels and rounded to two digits.

TABLE 1

| | Coupling Factor | | |
|---|---|---|---|
| Frequency | 38 µm Dielectric | Nominal 42 µm Dielectric | 46 µm Dielectric |
| 1 GHz | 39.97 dB | 40.37 dB | 40.76 dB |
| 2 GHz | 34.27 dB | 34.68 dB | 35.07 dB |
| 3 GHz | 30.89 dB | 31.30 dB | 31.69 dB |

As may be seen with reference to Table 1, coupling factor decreases by about 0.4 dB from nominal when the thickness of the dielectric is 4 µm too thin. Similarly, the coupling factor increases by about 0.4 dB when the thickness of the dielectric is 4 µm too thick. For reference, a 0.4 dB difference can yield about 10% error in power measurement if the variation in coupling factor is not accounted for.

Figure 6A:
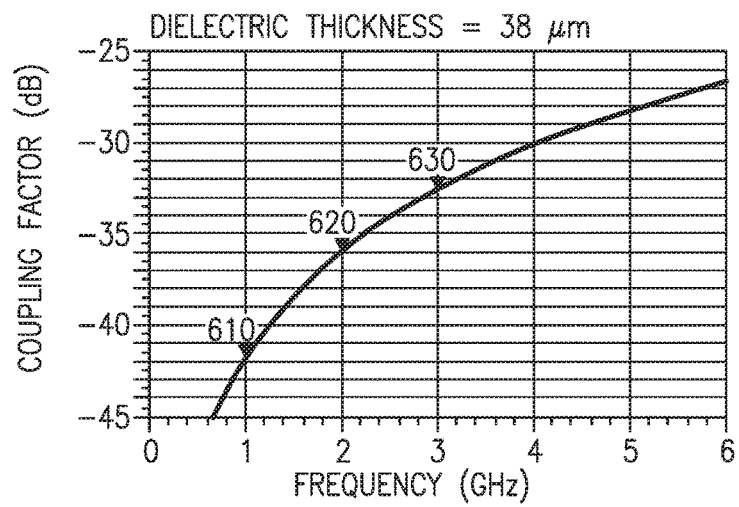
FIG. 6A is a graph of coupling factors across a range of frequencies for an embodiment of a compensated coupler for a dielectric thickness less than a nominal thickness.
Figure 6B:
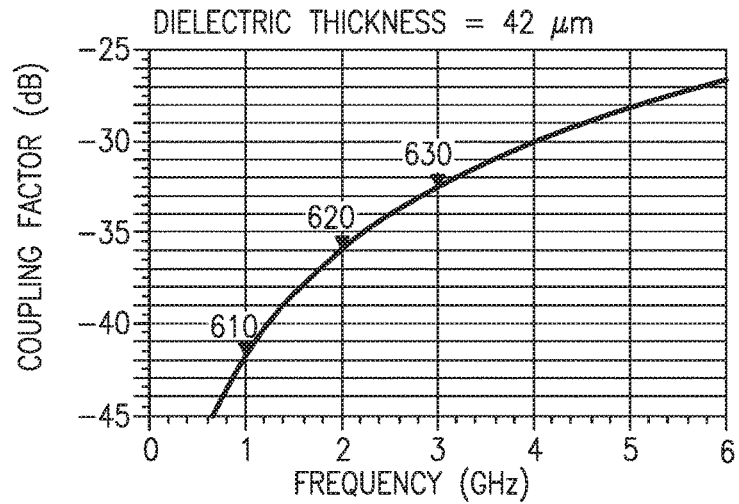
FIG. 6B is a graph of coupling factors across a range of frequencies for an embodiment of a compensated coupler for a nominal dielectric thickness.
Figure 6C:
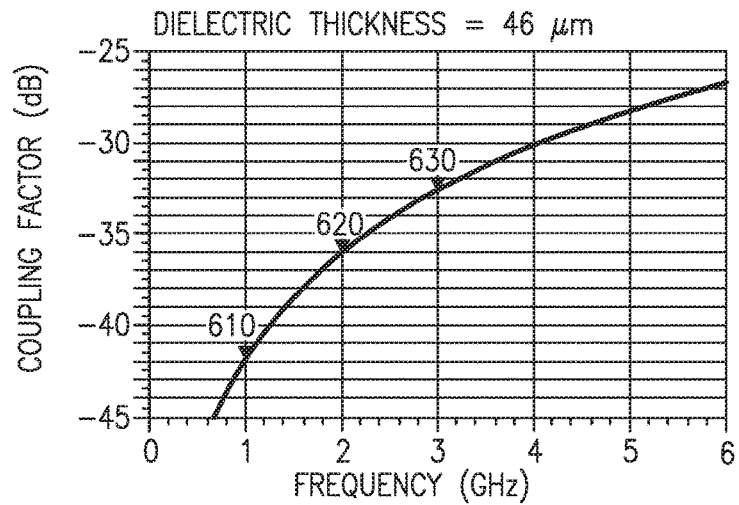
FIG. 6C is a graph of coupling factors across a range of frequencies for an embodiment of a compensated coupler for a dielectric thickness greater than a nominal thickness.

Using a tuning element 118, as shown in FIGS. 3A-3E, for example, in accord with aspects and embodiments disclosed herein, the variation in coupling factor may be greatly improved. Each of FIGS. 6A to 6C is a graph of coupling factor across a range of frequencies, generated from a simulation, for the same dielectric thicknesses as above, but for a coupler having the tuning element 118 as in the example embodiment of FIGS. 3A-3B. FIG. 6A shows the results for a dielectric thickness of 38 µm, while FIG. 6B shows the results for the nominal dielectric thickness of 42 µm, and FIG. 6C shows the results for a dielectric thickness of 46 µm. In each of FIGS. 6A to 6C, reference numeral 610 corresponds to the coupling factor at a frequency of 1 GHz, reference numeral 620 corresponds to the coupling factor at a frequency of 2 GHz, and reference numeral 630 corresponds to the coupling factor at a frequency of 3 GHz. The coupling factors at these specific frequencies, across varying dielectric thicknesses, for the example coupler design of FIGS. 3A-3B are tabulated in Table 2, again rounded to two digits in decibels.

TABLE 2

| | Coupling Factor | | |
|---|---|---|---|
| Frequency | 38 µm Dielectric | Nominal 42 µm Dielectric | 46 µm Dielectric |
| 1 GHz | 41.70 dB | 41.70 dB | 41.76 dB |
| 2 GHz | 35.92 dB | 35.93 dB | 35.98 dB |
| 3 GHz | 32.51 dB | 32.51 dB | 32.57 dB |

As may be seen with reference to Table 2, for the example embodiment of FIGS. 3A-3B, coupling factors are essentially unchanged when the thickness of the dielectric is 4 µm too thin, and only increases by a maximum of 0.06 dB when the thickness of the dielectric is 4 µm too thick. Table 2 shows a much lower variation in coupling factor, for varying dielectric thicknesses, when a tuning element 118 is provided as in the example embodiment of FIGS. 3A-3B.

As discussed above, the main transmission line 110, coupled line 112, and tuning element 118 may be straight (linear) traces of, e.g., electrical conductors, or may be non-linear. One or more of the main transmission line 110, coupled line 112, and tuning element 118 may have bends or curves and may be helical, spiral, or C-shaped, for example. In particular embodiments, any or all of the main transmission line 110, coupled line 112, and tuning element 118 may be formed into inductor turns or may be patterned, e.g., mesh, sawtooth, etc. In embodiments, any suitable shaping and relative proximity to achieve the desired coupling and compensation for variations is contemplated.

In the example embodiments of FIGS. 3A-3E, the tuning element 118 is shown with a switched 124 terminating grounding 122 at each end. Other embodiments may include grounding at various locations along the tuning element 118 and may include terminating impedances (1 ohm, 5 ohms, or 10 ohms, for example) to ground instead of a direct connection, or short, to ground. Certain embodiments may have switched connections implemented as Field Effect Transistors (FETs) or Micro Electro-Mechanical Switches (MEMS), for example, to selectively connect the tuning element 118 directly to ground or to ground through one or more impedances. Impedances may be selectable and/or adjustable, allowing further adjustability and allowing customizable coupling and compensation effect. In yet other embodiments the tuning element 118 may be electrically free floating with no path to ground. If the tuning element 118 is electrically free floating (open circuit), it will generally exhibit no effect and can thereby be selectively disconnected when not necessary for a particular application.

Additionally, one or more of the main transmission line 110, coupled line 112, and tuning element 118 may be sectioned so as to have selectively adjustable length. For example, a suitable set of switches (e.g., FETs, MEMS) may interconnect various sections of transmission line, and a controller can be programmed to control the switches and thereby selectively connect the various sections in multiple ways to form one or more main transmission lines 110, one or more coupled lines 112, and one or more tuning elements 118, to adjust to changing operational parameters or applications.

Figure 7:
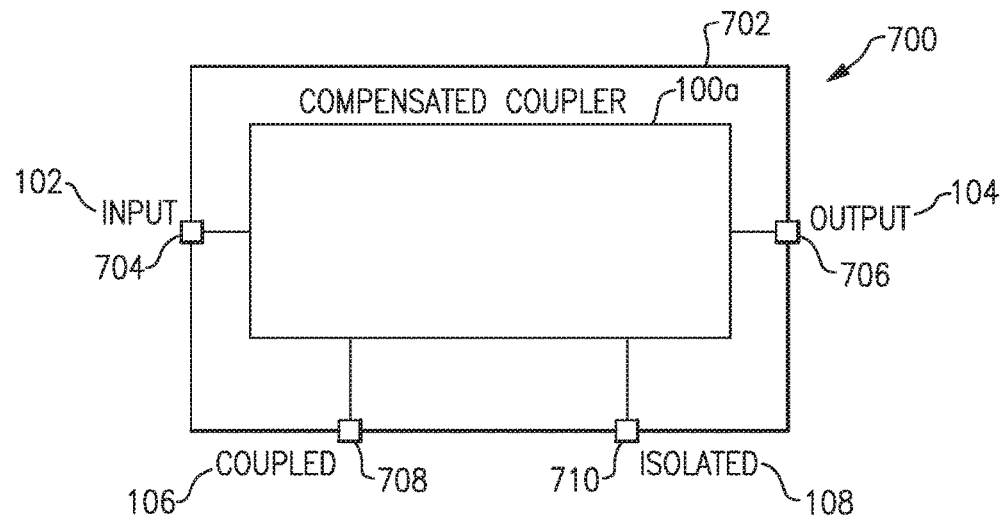
FIG. 7 is a block diagram of one example of a module including a compensated coupler.

Embodiments of the compensated coupler 100a described herein can be implemented in a variety of different modules including, for example, a stand-alone coupler module, a front-end module, a module combining the compensated coupler with an antenna switching network, an impedance matching module, an antenna tuning module, or the like. FIG. 7 illustrates one example of a coupler module that can include any of the embodiments or examples of the compensated coupler discussed herein.

FIG. 7 is a block diagram of one example of a module 700 that includes an embodiment of the compensated coupler 100a. The module 700 includes a substrate 702 and may include various dies and may include packaging, such as, for example, an overmold to provide protection and facilitate easier handling. An overmold may be formed over substrate 702 and dimensioned to substantially encapsulate the various dies and components thereon. The module 700 may further include connectivity from the coupler 100a to the exterior of the packaging to provide signal interconnections, such as input port connection 704, output port connection 706, coupled port connection 708, and isolation port connection 710. The connections 704, 706, 708, and 710 maybe wirebonds or solder bumps, for example.

Embodiments of the compensated coupler disclosed herein, optionally packaged into a module 700, may be advantageously used in a variety of electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a washer, a dryer, a washer/dryer, a peripheral device, a wrist watch, a clock, etc. Further, the electronic devices can include unfinished products.

Figure 8:
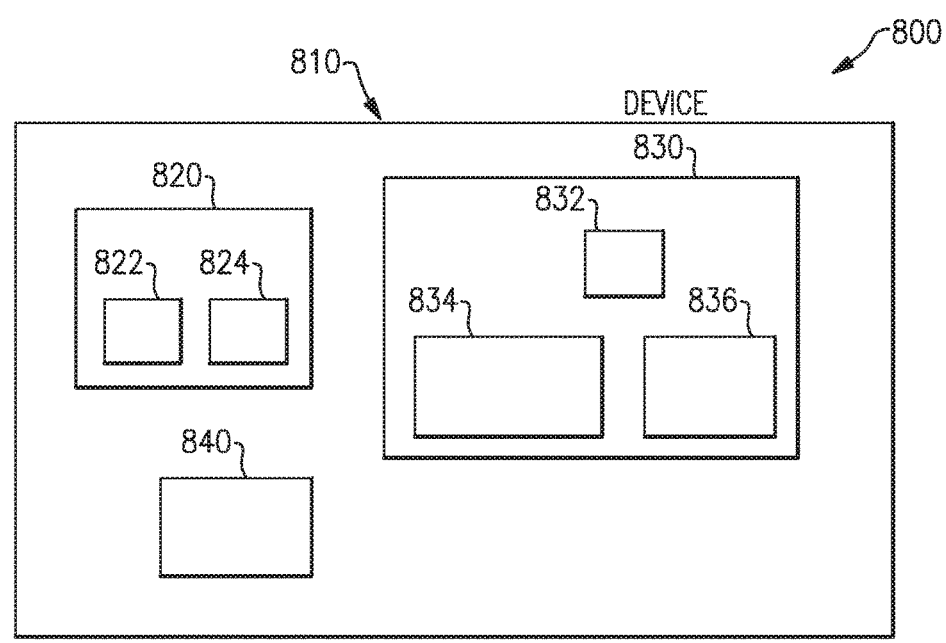
FIG. 8 is a block diagram of one example of an electronic device that may include a compensated coupler.

FIG. 8 is a schematic block diagram of a generic example of an electronic device 800. The electronic device 800 includes a circuit board 810 having numerous modules 820, 830, 840 mounted thereon. The circuit board 810 may have multiple layers and may include circuit elements and interconnections in the layers and/or mounted on the surface of the circuit board 810. Each of the modules 820, 830, 840 may have a multi-layer substrate within and upon which there may also be various circuit elements and interconnections. Additionally, the modules 820, 830, 840 may further include surface mounted dies, e.g., dies 822, 824, 832, 834, 836, each of which may have multiple layers and include various circuit elements and interconnections. A compensated EM coupler 100a in accord with aspects and embodiments disclosed herein may be implemented within, among, or across any of the layers of the various structures, e.g., circuit board, substrates, and dies, as part of an electronic device 800, such as a cell phone, tablet, smart device, router, cable modem, wireless access point, etc.

Figure 9A:
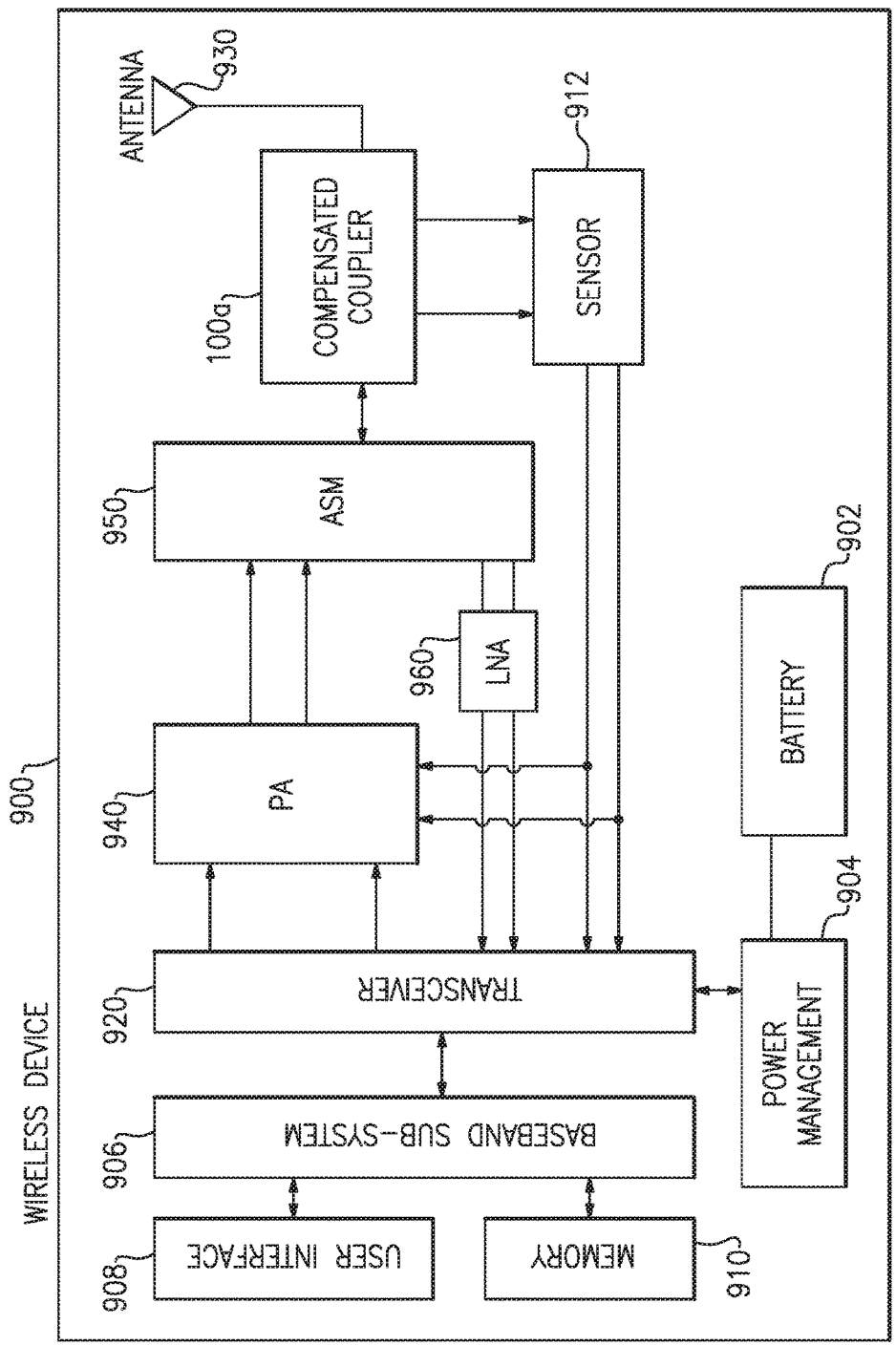
FIGS. 9A-9C are block diagrams of various examples of wireless devices that include a compensated coupler.
Figure 9B:
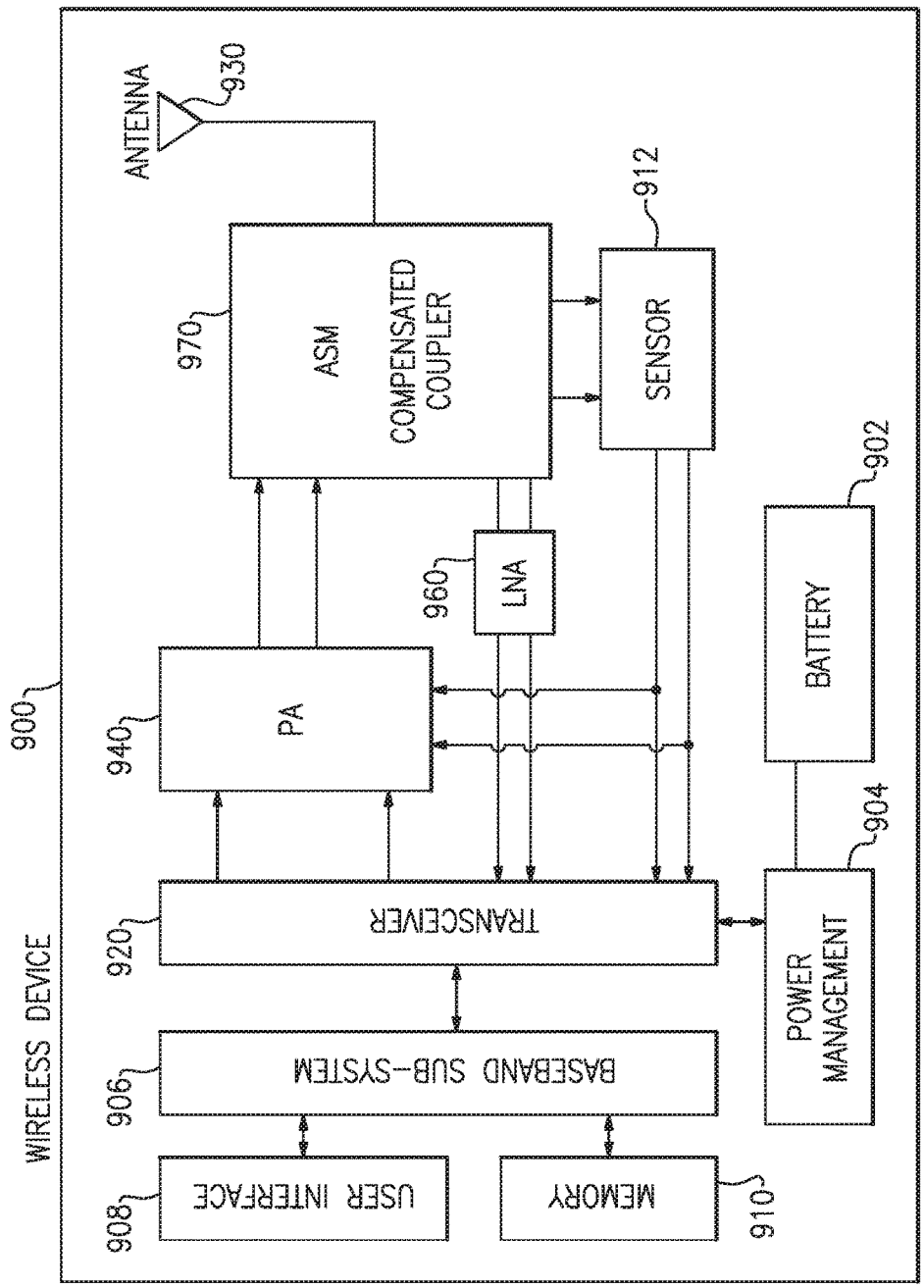
Figure 9C:
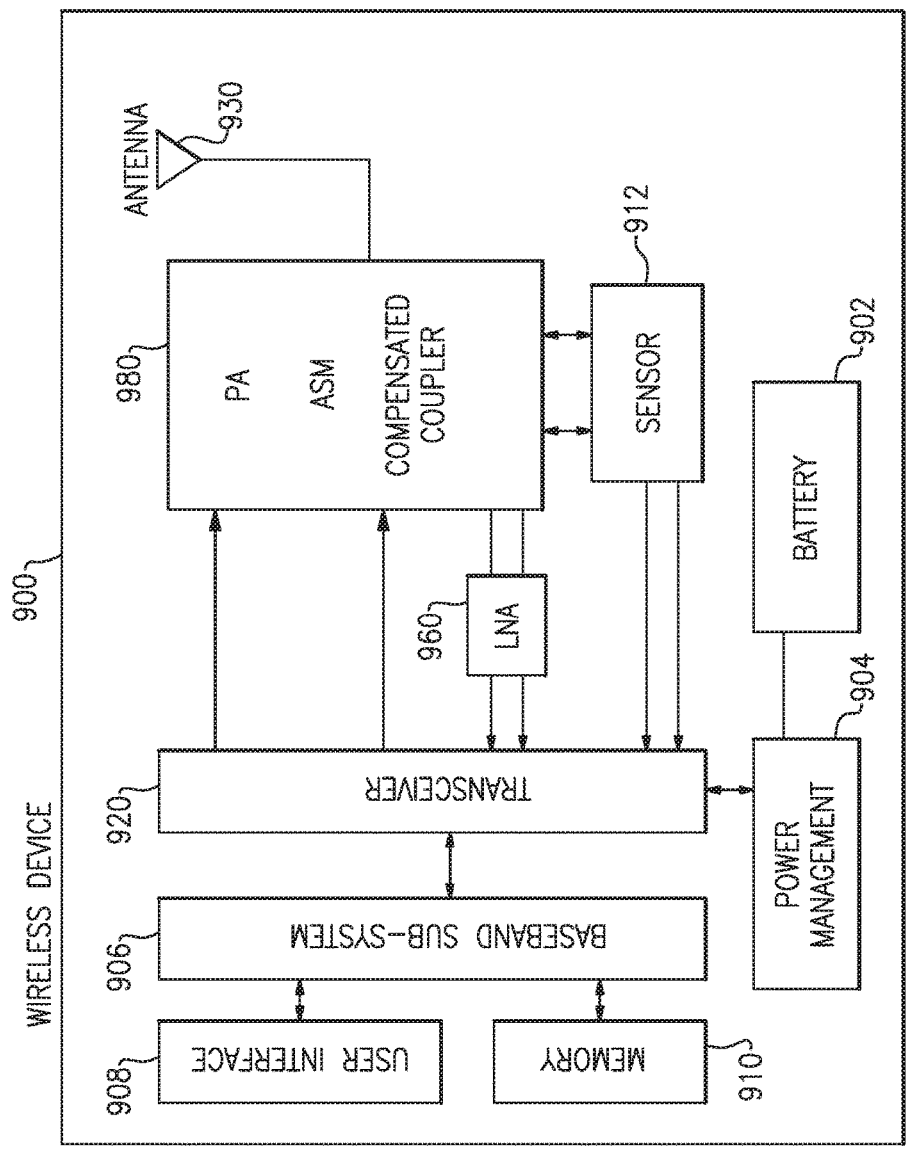

FIGS. 9A-9C illustrate examples of wireless devices including a compensated EM coupler 100a according to various embodiments discussed above. The EM coupler 100a is configured to extract a portion of power of an RF signal traveling between a transceiver 920 and an antenna 930. In general, the EM coupler 100a is a bi-directional coupler. As illustrated, in the forward or transmit direction, a power amplifier 940 receives an EM signal, such as an RF signal, from the transceiver 920 and provides an amplified signal to the antenna 930 via an antenna switch module 950 and the EM coupler 100a. Similarly, in the receive direction, a received signal is provided from the antenna 930 to the transceiver 920 via the EM coupler 100a, the antenna switch module 950, and a low noise amplifier 960. Various additional elements may be included in a wireless device, such as the wireless device 900 of FIGS. 9A-9C, and/or in some embodiments a sub-combination of the illustrated elements may be implemented.

The power amplifier 940 amplifies an RF signal. The power amplifier 940 can be any suitable power amplifier. For example, the power amplifier 940 can include one or more of a single stage power amplifier, a multi-stage power amplifier, a power amplifier implemented by one or more bipolar transistors, or a power amplifier implemented by one or more field effect transistors. The power amplifier 940 can be implemented on a GaAs die, CMOS die, or a SiGe die, for example.

The antenna 930 can transmit the amplified signal, and receive signals. For example, in a cellular phone, wireless base station, or the like, the antenna 930 can transmit and receive RF signals to and from other devices. In alternate embodiments multiple antennas may be used.

Operating in the forward mode, the EM coupler 100a can extract a portion of the power of the amplified signal traveling between the power amplifier 940 and the antenna 930. The EM coupler 100a can generate an indication of forward power traveling from the power amplifier 940 to the antenna 930, for example. Operating in the reverse mode, the EM coupler 100a can generate an indication of reflected power traveling from the antenna 930 toward the power amplifier 940, or can extract a portion of the power of a signal received by the antenna 930 from an external source. In either mode, the EM coupler 100a may provide the signal portion to a sensor 912 that provides power feedback by measuring the power of the signal portion.

The examples of wireless device 900 of FIGS. 9A-9C further include a power management system 904 that is connected to the transceiver 920 that manages the power for the operation of the wireless device. The power management system 904 can also control the operation of a baseband sub-system 906 and other components of the wireless device 900. The power management system 904 may manage power within the wireless device 900 by, for example, providing power to the wireless device 900 from a battery 902 or providing power to the wireless device 900 from a power connector, and controlling a charge level of the battery 902 by controlling charge and discharge cycles and/or status of the battery 902.

In one embodiment, the baseband sub-system 906 is connected to a user interface 908 to facilitate various input and output of voice and/or data provided to and received from the user. The baseband sub-system 906 can also be connected to memory 910 that is configured to store data and/or instructions to facilitate operation of the wireless device 900, and/or to provide storage of information for the user.

The power amplifier 940 can be used to amplify a wide variety of RF or other frequency-band transmission signals. For example, the power amplifier 940 can receive an enable signal that can be used to pulse the output of the power amplifier to aid in transmitting a wireless local area network (WLAN) signal or any other suitable pulsed signal. The power amplifier 940 can be configured to amplify any of a variety of types of signal, including, for example, a Global System for Mobile (GSM) signal, a code division multiple access (CDMA) signal, a W-CDMA signal, a Long Term Evolution (LTE) signal, an EDGE signal, and the like. In certain embodiments, the power amplifier 940 and associated components including switches and the like can be fabricated on GaAs substrates using, for example, pHEMT or BiFET transistors, or on a Silicon substrate using CMOS transistors, as well as other semiconductor fabrication technologies.

Still referring to FIGS. 9A-9C, the wireless device 900 can also include a compensated coupler 100a having one or more directional EM couplers for measuring transmitted power signals from the power amplifier 940 and for providing one or more coupled signals to a sensor module 912. The sensor module 912 can in turn send information to the transceiver 920 and/or directly to the power amplifier 940 as feedback for making adjustments to regulate the power level of the power amplifier 940. In this way the compensated coupler 100a can be used to boost/decrease the power of a transmission signal having a relatively low/high power. It will be appreciated, however, that the compensated coupler 100a can be used in a variety of other implementations.

In certain embodiments of any of the examples of the wireless device 900, transmissions from the wireless device 900 may have prescribed power limits and/or time slots. The power amplifier 940 may shift power envelopes up and down within prescribed limits of power versus time. For instance, a particular mobile phone can be assigned a transmission time slot for a particular frequency channel. In this case the power amplifier 940 may be required to regulate the power level of one or more RF power signals over time, so as to prevent signal interference from transmission during an assigned receive time slot and to reduce power consumption. In such systems, the compensated coupler 100a can be used to measure the power of a power amplifier output signal to aid in controlling the power amplifier 940, as discussed above. The implementations shown in FIGS. 9A-9C are intended to be exemplary in nature only and non-limiting.

The example shown in FIG. 9B includes a combination module 970 that includes a compensated coupler in accord with aspects and embodiments described herein combined with an antenna switch module (e.g., ASM 950). The example shown in FIG. 9C includes a combination module 980 that incorporates a compensated coupler, an antenna switch module, and a power amplifier (e.g., PA 940) together as a front end module (module 980). Additional embodiments include a front end module that further incorporates one or more low noise amplifiers (e.g., LNA 960) and/or sensors (e.g., sensor 912).

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. An electromagnetic coupler comprising:
    a dielectric layer having a first surface and a second surface, the second surface on an opposing side from the first surface;
    a first transmission line adjacent the first surface of the dielectric layer and extending between an input port and an output port;
    a second transmission line adjacent the second surface of the dielectric layer, the second transmission line electrically isolated from the first transmission line by the dielectric layer and extending between a coupled port and an isolation port, the second transmission line being configured to provide a coupled signal at the coupled port via electromagnetic coupling from the first transmission line responsive to receiving an input signal at the input port, an amplitude of the coupled signal being related to an amplitude of the input signal by a coupling factor; and
    a tuning element adjacent one of the first surface and the second surface of the dielectric layer and configured to stabilize the coupling factor via electromagnetic coupling over a range of variations in a thickness of the dielectric layer.

2. The electromagnetic coupler of claim 1 wherein the tuning element is short circuited to an electrical ground.

3. The electromagnetic coupler of claim 1 wherein the tuning element is connected to ground through an impedance.

4. The electromagnetic coupler of claim 3 wherein the impedance is adjustable.

5. The electromagnetic coupler of claim 1 wherein the tuning element is configured to be selectively decoupled from the first transmission line and the second transmission line.

6. The electromagnetic coupler of claim 1 wherein the second transmission line is laterally offset from at least one of the first transmission line and the tuning element.

7. The electromagnetic coupler of claim 1 wherein at least a portion of the second transmission line forms an overlapping region with at least one of the first transmission line and the tuning element.

8. A communication device comprising:
a transceiver configured to produce a transmit signal;
an electromagnetic coupler having an input port, an output port, a coupled port, and an isolation port, the electromagnetic coupler being configured to provide a coupled signal at the coupled port via electromagnetic coupling responsive to receiving an input signal at the input port, an amplitude of the coupled signal being related to an amplitude of the input signal by a coupling factor, and the electromagnetic coupler including a dielectric layer having a first surface and a second surface, a first transmission line adjacent the first surface extending between the input port and the output port, a second transmission line adjacent the second surface extending between the coupled port and the isolation port, the first transmission line and the second transmission line being electrically isolated, and a tuning element adjacent one of the first surface and the second surface and configured to stabilize the coupling factor via electromagnetic coupling over a range of variations in a thickness of the dielectric layer; and
an antenna switch module connected to either the input port or the output port of the electromagnetic coupler and configured to direct the transmit signal between the electromagnetic coupler and either of the transceiver or an antenna.

9. The communication device of claim 8 wherein the tuning element is short circuited to an electrical ground.

10. The communication device of claim 8 wherein the tuning element is connected to ground through an impedance.

11. The communication device of claim 10 wherein impedance is adjustable.

12. The communication device of claim 8 wherein the tuning element is configured to be selectively decoupled from the first transmission line and the second transmission line.

13. The communication device of claim 8 further comprising a power amplifier connected between the transceiver and the antenna switch module, the power amplifier being configured to receive and amplify the transmit signal.

14. The communication device of claim 8 wherein the electromagnetic coupler is further configured to receive the receive signal at the output port and to provide the receive signal at the input port, and the antenna switch module is further configured to direct the receive signal to the transceiver.

15. The communication device of claim 8 further comprising at least one of a sensor, a memory, a baseband sub-system, a user interface, and a battery.

16. A method of stabilizing a coupling factor of an electromagnetic coupler over a range of manufacturing process variations, the method comprising:
providing the electromagnetic coupler including a first transmission line adjacent a first surface of a dielectric layer and extending between an input port and an output port, a second transmission line adjacent a second surface of the dielectric layer and extending between a coupled port and an isolation port, the first transmission line and the second transmission line being electrically isolated, and the second transmission line being configured to provide a coupled signal at the coupled port via electromagnetic coupling from the first transmission line responsive to receiving an input signal at the input port, an amplitude of the coupled signal being related to an amplitude of the input signal by the coupling factor; and
providing a tuning element electrically isolated from the first transmission line and the second transmission line and configured to stabilize the coupling factor via electromagnetic coupling with at least one of the first transmission line and the second transmission line over a range of thickness of the dielectric layer.

17. The method of claim 16 further comprising selectively connecting the tuning element to an electrical ground.

18. The method of claim 16 further comprising connecting the tuning element to an impedance.

19. The method of claim 16 further comprising connecting the tuning element to an adjustable impedance.

20. The method of claim 19 further comprising adjusting the adjustable impedance to maintain the coupling factor within a predetermined range of values.

* * * * *